US012699315B2

(12) United States Patent
Kim et al.

(10) Patent No.: US 12,699,315 B2
(45) Date of Patent: Aug. 4, 2026

(54) METHODS OF MANUFACTURING A PELLICLE HAVING GRAPHITE LAYER

(71) Applicant: Samsung Electronics Co., Ltd., Suwon-si (KR)

(72) Inventors: Mun Ja Kim, Hwaseong-si (KR); Ji-Beom Yoo, Seoul (KR); Qicheng Hu, Suwon-si (KR); Changyoung Jeong, Yongin-si (KR); Ki-Bong Nam, Suwon-si (KR); Jin-Ho Yeo, Suwon-si (KR)

(73) Assignees: SAMSUNG ELECTRONICS CO., LTD.; RESEARCH AND BUSINESS FOUNDATION SUNGKYUNKWAN UNIVERSITY

( * ) Notice: Subject to any disclaimer, the term of this patent is extended or adjusted under 35 U.S.C. 154(b) by 937 days.

(21) Appl. No.: 17/712,161

(22) Filed: Apr. 3, 2022

(65) Prior Publication Data

US 2022/0350240 A1     Nov. 3, 2022

(30) Foreign Application Priority Data

May 3, 2021     (KR) ........................ 10-2021-0057481

(51) Int. Cl.
*G03F 1/64* (2012.01)
*C23C 16/02* (2006.01)
*C23C 16/26* (2006.01)
*C23C 16/50* (2006.01)

(52) U.S. Cl.
CPC ............ *G03F 1/64* (2013.01); *C23C 16/0272* (2013.01); *C23C 16/26* (2013.01); *C23C 16/50* (2013.01)

(58) Field of Classification Search
CPC ....... G03F 1/64; C23C 16/0272; C23C 16/26; C23C 16/50
See application file for complete search history.

(56) References Cited

U.S. PATENT DOCUMENTS

| | | | |
|---|---|---|---|
| 8,697,230 B2 | 4/2014 | Ago et al. | |
| 9,703,187 B2 | 7/2017 | Ono et al. | |
| 9,776,875 B2 | 10/2017 | Kim et al. | |
| 9,875,894 B2 | 1/2018 | Sumant et al. | |

(Continued)

FOREIGN PATENT DOCUMENTS

| | | |
|---|---|---|
| CN | 109324474 A | 2/2019 |
| CN | 111836681 A | 10/2020 |

(Continued)

OTHER PUBLICATIONS

English machine translation of KR-20090060846-A (Jun. 2009) (Year: 2009).*
English machine translation of WO-2019172418-A1 (Sep. 2019) (Year: 2019).*
Derbyshire, F.J, et al., "Graphite Formation By the Dissolution-Precipitation of Carbon in Cobalt, Nickel and Iron," Carbon, 1975, vol. 13, pp. 111-113, Pergamon Press., Great Britain (3 pages).

(Continued)

*Primary Examiner* — Jonathan Johnson
*Assistant Examiner* — Jayson D Cosgrove
(74) *Attorney, Agent, or Firm* — Muir Patent Law, PLLC

(57) ABSTRACT

A method for manufacturing a pellicle according to the technical idea of the present invention includes preparing a support substrate, forming a catalyst layer including nickel (Ni) in which one selected from a (110) plane and a (100) plane is a dominant crystal plane, on the support substrate, and performing a chemical vapor deposition process on the catalyst layer at about 1050° C. or less to form a membrane having a graphite layer.

16 Claims, 11 Drawing Sheets

(56) References Cited

U.S. PATENT DOCUMENTS

| | | | |
|---|---|---|---|
| 10,007,176 B2 | 6/2018 | Tu et al. | |
| 10,539,868 B2 | 1/2020 | Shin et al. | |
| 10,747,103 B2 | 8/2020 | Lin et al. | |
| 10,866,507 B2 | 12/2020 | Moon et al. | |
| 10,996,556 B2 | 5/2021 | Lee et al. | |
| 11,467,486 B2 | 10/2022 | Kurganova et al. | |
| 2012/0225296 A1 | 9/2012 | Zhong et al. | |
| 2014/0080291 A1* | 3/2014 | Nozawa | H10P 14/27 |
| | | | 438/478 |
| 2014/0261998 A1* | 9/2014 | Veerasamy | C23C 16/26 |
| | | | 156/247 |
| 2017/0029942 A1 | 2/2017 | Matsumoto | |
| 2017/0090279 A1* | 3/2017 | Ono | G03F 1/62 |
| 2018/0059535 A1* | 3/2018 | Tu | G03F 1/62 |
| 2018/0275508 A1* | 9/2018 | Kim | G03F 1/64 |
| 2020/0401038 A1 | 12/2020 | Kawashima et al. | |
| 2020/0406244 A1 | 12/2020 | Kurganova et al. | |

FOREIGN PATENT DOCUMENTS

| | | | | |
|---|---|---|---|---|
| JP | 3454901 B2 | 10/2003 | | |
| JP | 2015018228 A | 1/2015 | | |
| KR | 20090060846 A * | 6/2009 | | C23C 16/26 |
| KR | 1020150129020 A | 11/2015 | | |
| KR | 101600397 B1 | 3/2016 | | |
| KR | 1020180109177 A | 10/2018 | | |
| WO | WO-2019172418 A1 * | 9/2019 | | H10P 50/242 |

OTHER PUBLICATIONS

Robertson, S.D., "Carbon Formation From Methane Pyrolysis Over Some Transition Metal Surfaces-II. Manner of Carbon and Graphite Formation," Carbon, 1972, vol. 10, pp. 221-229, Pergamon Press., Great Britain (15 pages).

S. Hoffmann, et al., "Surface Diffusion: The Low Activation Energy Path for Nanotube Growth," Phys. Rev. Lett., Jul. 15, 2005, v.95, 036101 (4 pages).

Sonobe,et al., "Formation of Graphite Thin Film From Polyfurfuryl Alcohol and Polyvinyl Acetate Carbons Prepared Between Thelamel-lae of Montmorillonite," Carbon, 1991, v. 29, No. 1, pp. 61-67, Great Britain (7 pages).

Stig Helveg et al., "Atomic-scale imaging of carbon nanofibre growth," Nature, vol. 427, Jan. 29, 2004, pp. 426-429 (4 pages).

Suklyun Hong, et al., "Crystal Shape of a Nickel Particle Related to Carbon Nanotube Growth," Jpn. J. Appl. Phys., vol. 41 (2002), pp. 6142-6144 (3 pages).

Yajima, S. et al., "Mechanism of the Pyrolytic Graphite Formation," Journal of Nuclear Materials, North-Holland Publishing Co., Amsterdam, (1965), pp. 116-126 (11 pages).

Zhiping Xu, Markus J. Buehler, "Interface structure and mechanics between graphene and metal substrates: a first-principles study," J. Phys.: Condens. Matter (2010), v. 22, 485301 (5 pages).

Office Action dated Jan. 7, 2023 issued from the Taiwan Intellectual Property Office for corresponding TW Patent Application No. 111115668.

* cited by examiner

1000

1100

—10

—20
—10

—30
—20
—10

S200

START

PREPARE FOIL — S210

FORM CATALYST LAYER ON FOIL — S220

LOAD FOIL INTO SEMICONDUCTOR MANUFACTURING DEVICE AND FORM MEMBRANE ON CATALYST LAYER — S230

UNLOAD FOIL FROM SEMICONDUCTOR MANUFACTURING DEVICE AND FORM PELLICLE BY PERFORMING SEPARATION PROCESS — S240

END

Figure 6A:
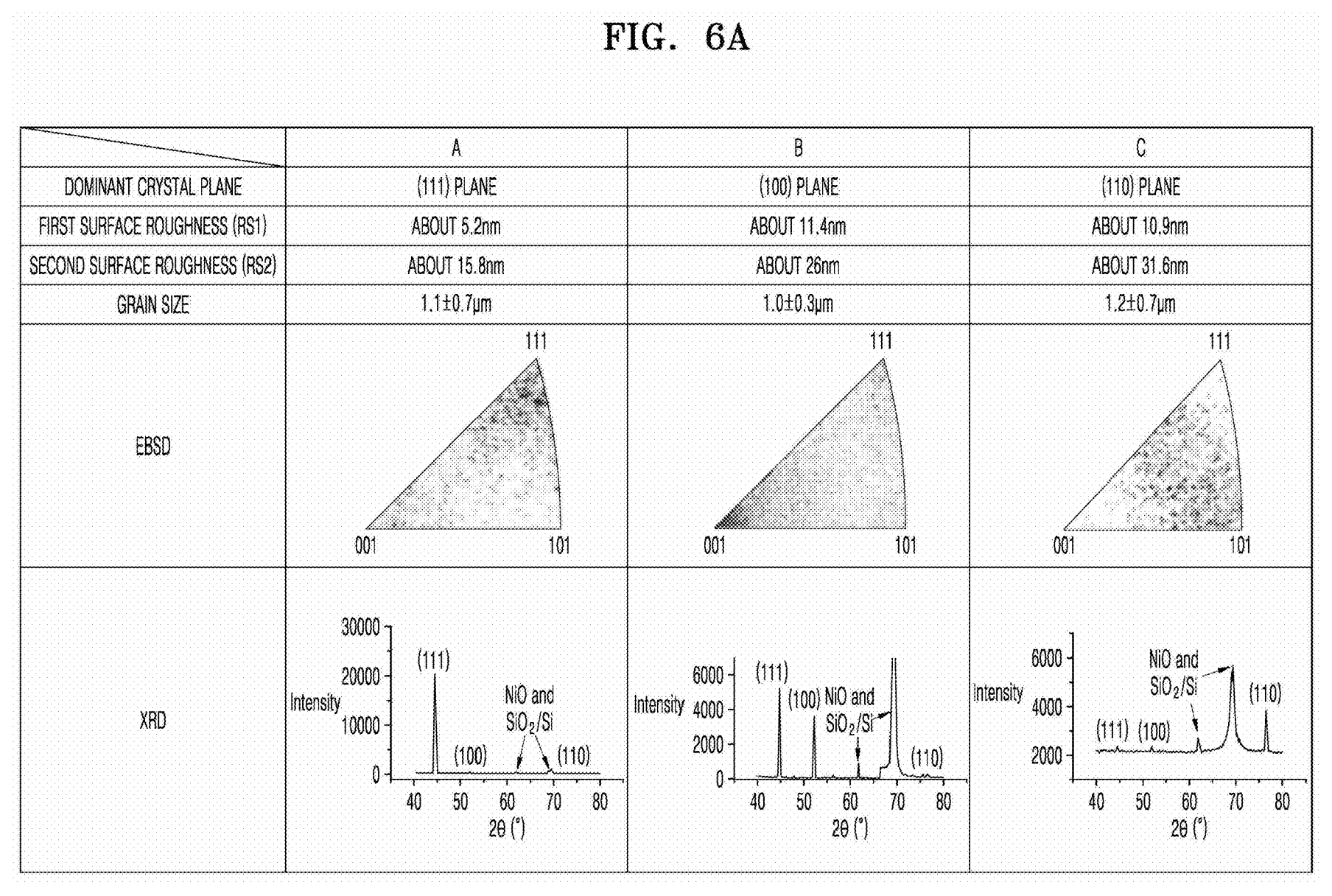

| | A | B | C |
|---|---|---|---|
| DOMINANT CRYSTAL PLANE | (111) PLANE | (100) PLANE | (110) PLANE |
| FIRST SURFACE ROUGHNESS (RS1) | ABOUT 5.2nm | ABOUT 11.4nm | ABOUT 10.9nm |
| SECOND SURFACE ROUGHNESS (RS2) | ABOUT 15.8nm | ABOUT 26nm | ABOUT 31.6nm |
| GRAIN SIZE | $1.1\pm0.7\mu m$ | $1.0\pm0.3\mu m$ | $1.2\pm0.7\mu m$ |
| EBSD | | | |
| XRD | | | |

METHODS OF MANUFACTURING A PELLICLE HAVING GRAPHITE LAYER

CROSS-REFERENCE TO RELATED APPLICATION

This application is based on and claims priority under 35 U.S.C. § 119 to Korean Patent Application No. 10-2021-0057481, filed on May 3, 2021, in the Korean Intellectual Property Office, the disclosure of which is incorporated by reference herein in its entirety.

BACKGROUND

The present disclosure herein relates to a method for manufacturing a pellicle, and more particularly, to a method for manufacturing a pellicle having a graphite layer.

A photolithography process using extreme ultraviolet (EUV) light as a light source uses a reflective photomask. A pellicle is needed to protect the pattern of the reflective photomask from physical and chemical contamination. In order to protect the surface of the reflective photomask from external contamination, these pellicles are disposed on a reflective photomask at a predetermined interval, and must be maintained without deformation or damage for a certain period of time while having a high transmittance of EUV light in an exposure environment for lithography.

SUMMARY

The present disclosure provides a pellicle for extreme ultraviolet exposure having a graphite layer capable of maintaining a constant light transmittance in an extreme ultraviolet exposure environment.

The problems to be solved by the technical spirit of the present invention are not limited to the problems mentioned above, and other problems not mentioned will be clearly understood by those skilled in the art from the following description.

A method for manufacturing a pellicle according to the technical idea of the present invention includes: preparing a support substrate; forming a catalyst layer on the support substrate, the catalyst layer including nickel (Ni) in which one selected from a (110) plane and a (100) plane is a dominant crystal plane; and performing a chemical vapor deposition process on the catalyst layer at about 1050° C. or less to form a membrane having a graphite layer.

A method for manufacturing a pellicle according to the technical idea of the present invention includes: preparing a nickel (Ni) foil; forming a catalyst layer on the nickel (Ni) foil, the catalyst layer including nickel (Ni), in which a (111) plane is a dominant crystal plane; and performing a chemical vapor deposition process on the catalyst layer at about 1050° C. or less to form a membrane having a graphite layer; and removing the nickel (Ni) foil.

A method of manufacturing a pellicle for extreme ultraviolet (EUV) exposure used in lithography equipment using EUV light as a light source according to the technical idea of the present invention includes: preparing a support substrate; forming a catalyst layer on the support substrate, the catalyst layer including nickel (Ni), in which one selected from the (111) plane, the (110) plane, and the (100) plane is a dominant crystal plane; forming a membrane having a graphite layer on the catalyst layer by performing a chemical vapor deposition process using a hydrocarbon-based precursor at about 1050° C. or less; and transferring the membrane having the graphite layer onto a frame.

A method of forming a mask pattern according to the technical idea of the present invention includes: applying a photoresist for extreme ultraviolet (EUV) exposure on a semiconductor substrate; irradiating EUV light reflected from a reflective photomask to which a pellicle for EUV exposure is attached to the photoresist for EUV exposure; and forming a mask pattern by developing the photoresist for EUV exposure, wherein manufacturing the pellicle for EUV exposure includes: preparing a support substrate; forming a on the support substrate, the catalyst layer including nickel (Ni), in which one selected from a (110) plane and a (100) plane is a dominant crystal plane; and performing a chemical vapor deposition process on the catalyst layer at about 1050° C. or less to form a membrane having a graphite layer.

BRIEF DESCRIPTION OF THE DRAWINGS

Embodiments of the inventive concept will be more clearly understood from the following detailed description taken in conjunction with the accompanying drawings in which like numerals refer to like elements throughout. In the drawings:

FIGS. 5A to 5D are views showing a method of manufacturing a pellicle in order, according to another example embodiment of the technical idea of the present invention;

FIGS. 6A and 6B are images showing analysis results of a catalyst layer and a membrane, according to example embodiments of the technical concept of the present invention;

DETAILED DESCRIPTION OF THE EMBODIMENTS

Hereinafter, embodiments of the technical idea of the present invention will be described in detail with reference to the accompanying drawings.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention.

Figure 1A:
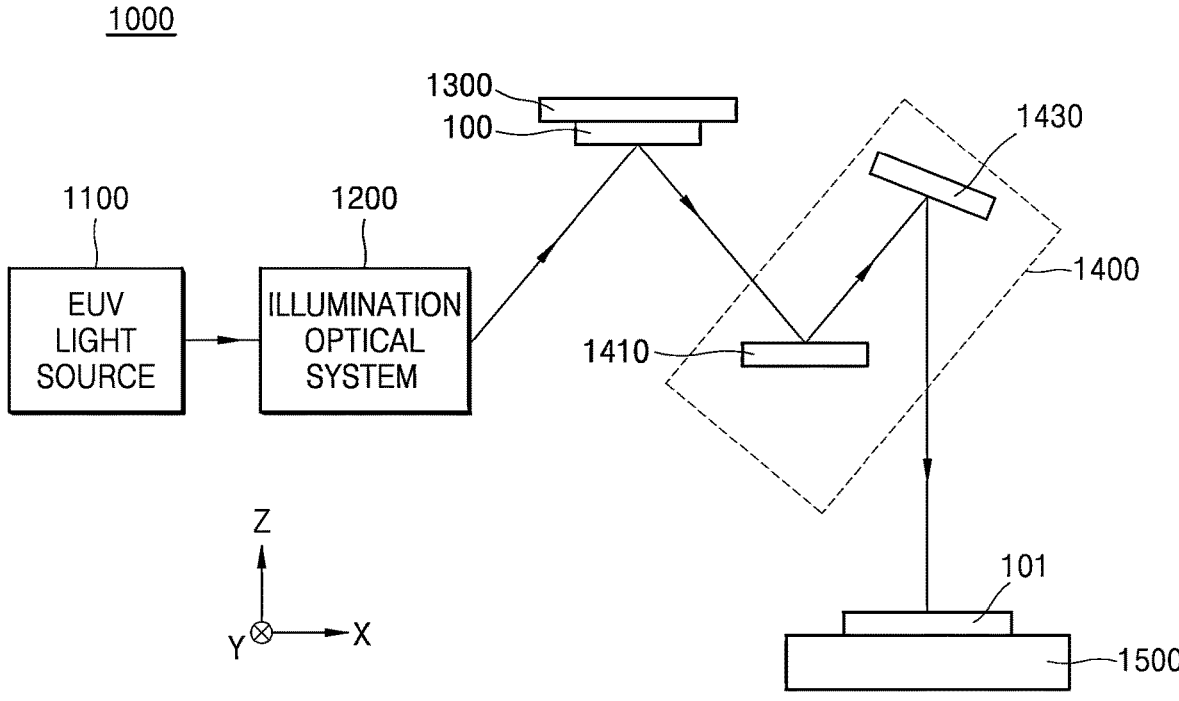
FIGS. 1A and 1B are configuration diagrams schematically illustrating an extreme ultraviolet (EUV) exposure device, according to example embodiments of the technical idea of the present invention.
Figure 1B:
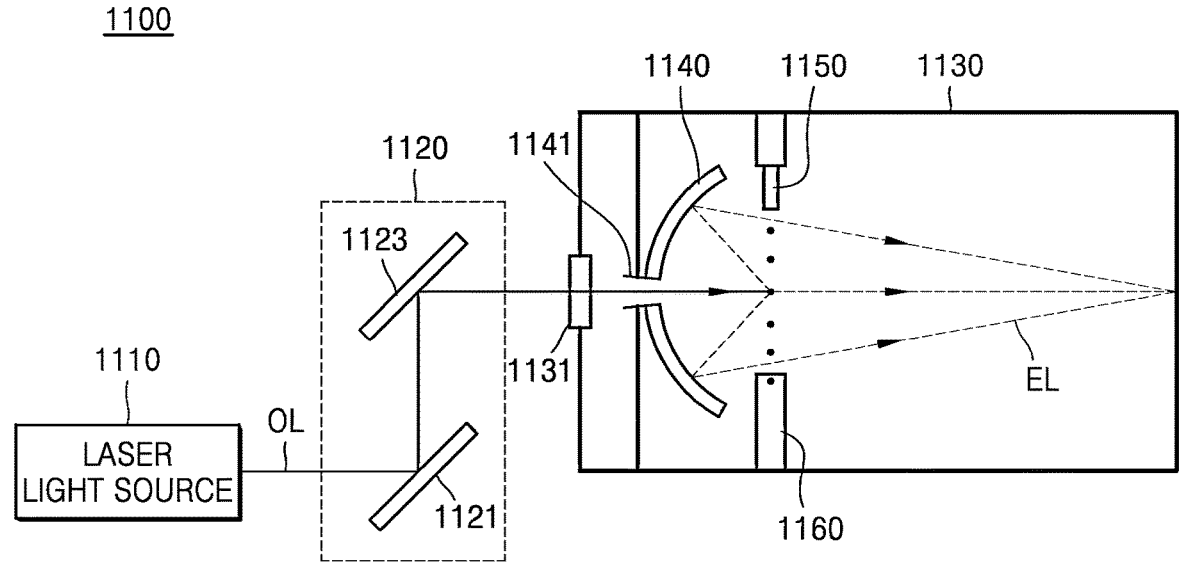

FIGS. 1A and 1B are diagrams schematically illustrating an EUV exposure device according to an example embodiment of the technical idea of the present invention.

Referring to FIGS. 1A and 1B together, the EUV exposure device 1000 may include an EUV light source 1100, an illumination optical system 1200, a photomask supporter 1300, a projection optical system 1400, and a substrate stage 1500.

The EUV light source 1100 may generate and output EUV light EL having a high energy density. In some embodiments, the EUV light EL may have a wavelength of about 4 nm to about 20 nm, and in some embodiments, the EUV light EL may have a wavelength of 13.5 nm.

The EUV light source 1100 may be a plasma-based light source or a synchrotron radiation light source. Here, the plasma-based light source means a light source of a method that generates plasma and uses light emitted by the plasma, and there are a laser produced plasma light source, a discharge produced plasma light source, and the like.

The EUV light source 1100 includes a laser light source 1110, a transmission optical system 1120, a vacuum chamber 1130, a collector mirror 1140, a droplet generator 1150, and a droplet catcher 1160.

The laser light source 1110 may be configured to output the laser light OL. For example, the laser light source 1110 may output a carbon dioxide laser light. The laser light OL output from the laser light source 1110 may be incident on the window 1131 of the vacuum chamber 1130 through a plurality of reflection mirrors 1121 and 1123 included in the transmission optical system 1120, and may be introduced into the vacuum chamber 1130.

An aperture 1141 through which the laser light OL may pass may be formed in the center of the collector mirror 1140, and the laser light OL may be introduced into the vacuum chamber 1130 through the aperture 1141 of the collector mirror 1140.

The droplet generator 1150 may interact with the laser light OL to generate a droplet generating EUV light EL, and provide the droplet to the inside of the vacuum chamber 1130. The droplet may include at least one of tin (Sn), lithium (Li), and xenon (Xe). For example, the droplet may include at least one of tin (Sn), a tin compound (e.g., $SnBr_4$, $SnBr_2$, SnH), or a tin alloy (e.g., Sn—Ga, Sn—In, Sn—In—Ga).

The droplet catcher 1160 may be located below the droplet generator 1150 and may be configured to collect the droplets that do not react with the laser light OL. The droplets provided from the droplet generator 1150 may react with the laser light OL introduced into the vacuum chamber 1130 to generate EUV light EL. The collector mirror 1140 may collect and reflect the EUV light EL, thereby emitting the EUV light EL to the illumination optical system 1200 disposed outside the vacuum chamber 1130.

The illumination optical system 1200 may include a plurality of reflection mirrors, and may transmit EUV light EL emitted from the EUV light source 1100 to the EUV photomask 100. For example, EUV light EL emitted from the EUV light source 1100 may be reflected by a reflection mirror in the illumination optical system 1200 and may be incident on the EUV photomask 100 disposed on the photomask supporter 1300.

The EUV photomask 100 may be a reflective mask having a reflective region and a non-reflective (or intermediate reflective) region. The EUV photomask 100 may include a reflective multilayer film formed on a mask substrate formed of a material having a low coefficient of thermal expansion, such as silicon (Si), and an absorption pattern formed on the reflective multilayer film. Here, the reflective multilayer film may correspond to a reflective region, and the absorption pattern may correspond to a non-reflective (or intermediate reflective) region. Hereinafter, the reflective multilayer film and the absorption pattern are referred to as a reflective pattern.

The EUV photomask 100 requires a pellicle to protect the reflective pattern from physical and chemical contamination. The pellicle is disposed on the reflective pattern at a predetermined interval in order to protect the surface of the reflective pattern from external contamination. Details of the pellicle according to the embodiment of the present invention will be described later.

The EUV photomask 100 reflects EUV light EL incident through the illumination optical system 1200 to be incident on the projection optical system 1400. Specifically, the EUV photomask 100 structuralizes the light incident from the illumination optical system 1200 into projection light, and injects the projection light into the projection optical system 1400 based on the shape of the reflective pattern on the mask substrate. The transmission light may be structured through at least a second diffraction order due to the EUV photomask 100. This transmission light may be incident on the projection optical system 1400 while retaining information on the pattern shape of the EUV photomask 100, and may pass through the projection optical system 1400 to form an image corresponding to the pattern shape of the EUV photomask 100 on the semiconductor substrate 101.

The projection optical system 1400 may include a plurality of reflection mirrors 1410 and 1430. Although the drawing shows two reflection mirrors 1410 and 1430 in the projection optical system 1400, this is for convenience of description, and the projection optical system 1400 may include more reflection mirrors than this. For example, the projection optical system 1400 may generally include 4 to 8 reflection mirrors. However, the number of reflection mirrors included in the projection optical system 1400 is not limited to the above numerical values.

The semiconductor substrate 101 may be disposed on the substrate stage 1500. The substrate stage 1500 may move in the X and Y directions on the X-Y plane, and may move in the Z direction perpendicular to the X-Y plane. By the movement of the substrate stage 1500, the semiconductor substrate 101 may also move in the X direction, the Y direction, and the Z direction in the same manner.

Figure 2:
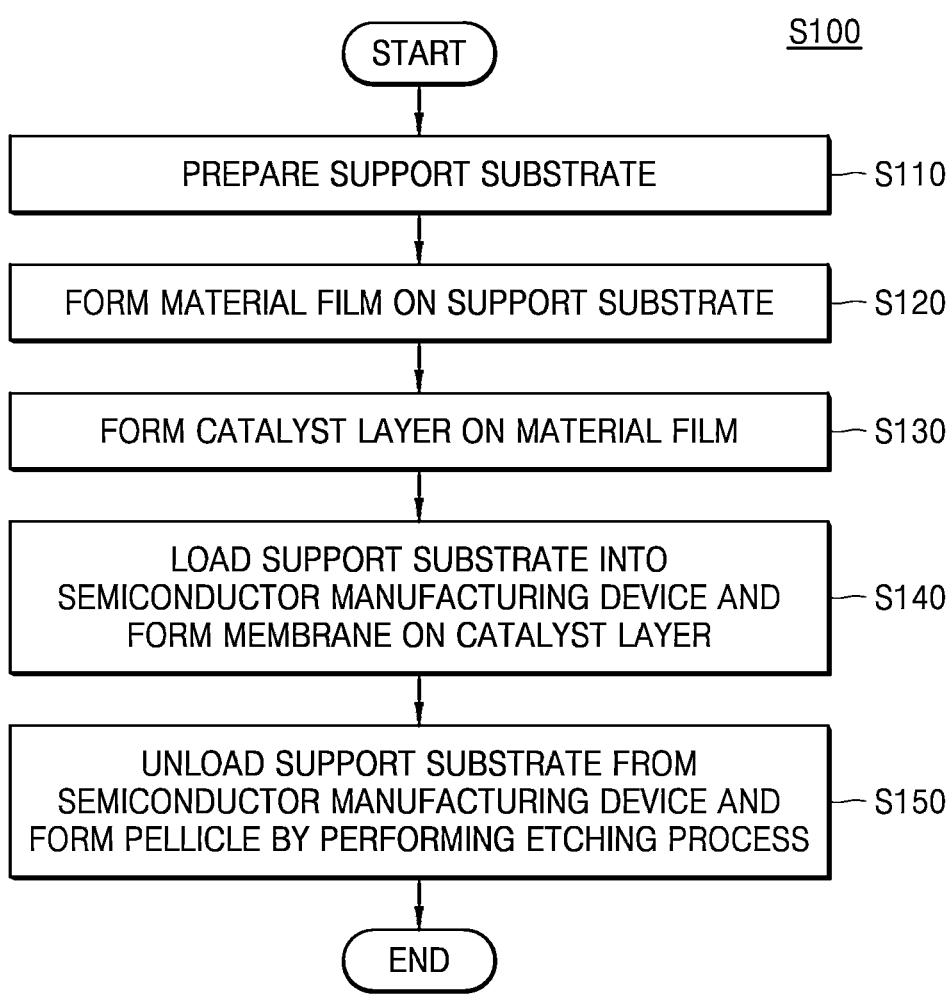
FIG. 2 is a block diagram illustrating a method of manufacturing a pellicle, according to an example embodiment of the technical idea of the present invention.

FIG. 2 is a block diagram illustrating a method of manufacturing a pellicle according to an example embodiment of the technical idea of the present invention, and FIGS. 3A to 3E are views sequentially illustrating a method of manufacturing a pellicle according to an example embodiment of the technical idea of the present invention.

In this specification, when certain embodiments are otherwise practicable, a specific process order may be performed differently from the described order. For example, two processes described in succession may be substantially simultaneously performed, or may be performed in an order opposite to the described order.

Figure 3A:
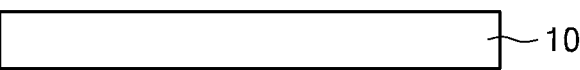
FIGS. 3A to 3E are views showing a method of manufacturing a pellicle in order, according to an example embodiment of the technical idea of the present invention.

Referring to FIGS. 2 and 3A, the method S100 for manufacturing a pellicle according to an example embodiment of the technical idea of the present invention may include a first operation S110 of preparing the support substrate 10.

The support substrate 10 may be a wafer including silicon (Si). In some embodiments, the support substrate 10 may be a metal substrate or a glass substrate. For example, the support substrate may be a silicon (Si) wafer substrate or a nickel (Ni) foil having a thickness of about 25 m. The support substrate 10 may be any substrate capable of supporting the material film 20 (see FIG. 3B) and the catalyst layer 30 (see FIG. 3C), which will be described later, and is not particularly limited.

Figure 3B:

Referring to FIGS. 2 and 3B, the method for manufacturing a pellicle (S100) according to an example embodiment of the technical idea of the present invention may include a second operation S120 of forming the material film 20 on the support substrate 10.

Any one material film 20 selected from silicon oxide, silicon nitride, metal oxide, and a polymer thin film may be formed on the support substrate 10. The material film 20 may be formed to have a thickness between about 100 nm and about 300 nm.

In some embodiments, the material film 20 may be formed by performing a chemical vapor deposition (CVD) process or a physical vapor deposition (PVD) process. The material film 20 may include a silicon (Si)-based insulating material. For example, the material film 20 may include a thin film such as silicon oxide, silicon nitride, spin-on glass (SOG), or tetraethyl orthosilicate (TEOS). Alternatively, the material film 20 may include a metal thin film. For example, the material film 20 may include a metal oxide thin film such as ZnO, MoO, NbO, or the like.

In other embodiments, the material film 20 may be formed by performing a spin coating process. The material film 20 may include a polymer thin film. For example, the material film 20 may include a thin film such as polyamide (PA), polycarbonate (PC), polyimide (PI), polyethylene terephthalate (PET), or polymethylmethacrylate (PMMA).

Alternatively, the material film 20 may be omitted. In this case, a catalyst layer 30 (see FIG. 3C) to be described later may be directly formed on the support substrate 10.

Figure 3C:
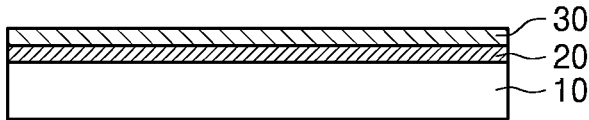

Referring to FIGS. 2 and 3C, the method S100 of manufacturing a pellicle according to an example embodiment of the present invention may include a third operation S130 of forming a catalyst layer 30 on the material film 20.

The catalyst layer 30 may include nickel (Ni). Specifically, the catalyst layer 30 may include nickel (Ni) in which any one selected from the (110) plane and the (100) plane is the dominant crystal plane. Here, the dominant crystal plane means that one crystal plane is more distributed than the other crystal planes.

In order for the catalyst layer 30 to have this dominant crystal plane, nickel (Ni) may be formed on the material film 20 under the following conditions. Specifically, nickel (Ni) in the catalyst layer 30 may be formed to have a grain size of about 100 nm or less. In addition, nickel (Ni) in the catalyst layer 30 may be formed to have a thickness of any one selected from about 500 nm, about 1 m, and about 5 m in the range of about 500 nm to about 5 m.

When an electron backscatter diffraction (EBSD) analysis method is used for nickel (Ni) in the catalyst layer 30 grown under the above conditions, it is possible to obtain a distribution result of the crystal plane as shown in FIG. 6A, which will be described later. For example, the catalyst layer 30 may include nickel (Ni) in which the (110) plane is the dominant crystal plane, or the catalyst layer 30 may include nickel (Ni) in which the (100) plane is the dominant crystal plane. The inventors of the present invention found that the dominant crystal plane of nickel (Ni) significantly affects the sintering of the graphite layer.

Figure 3D:
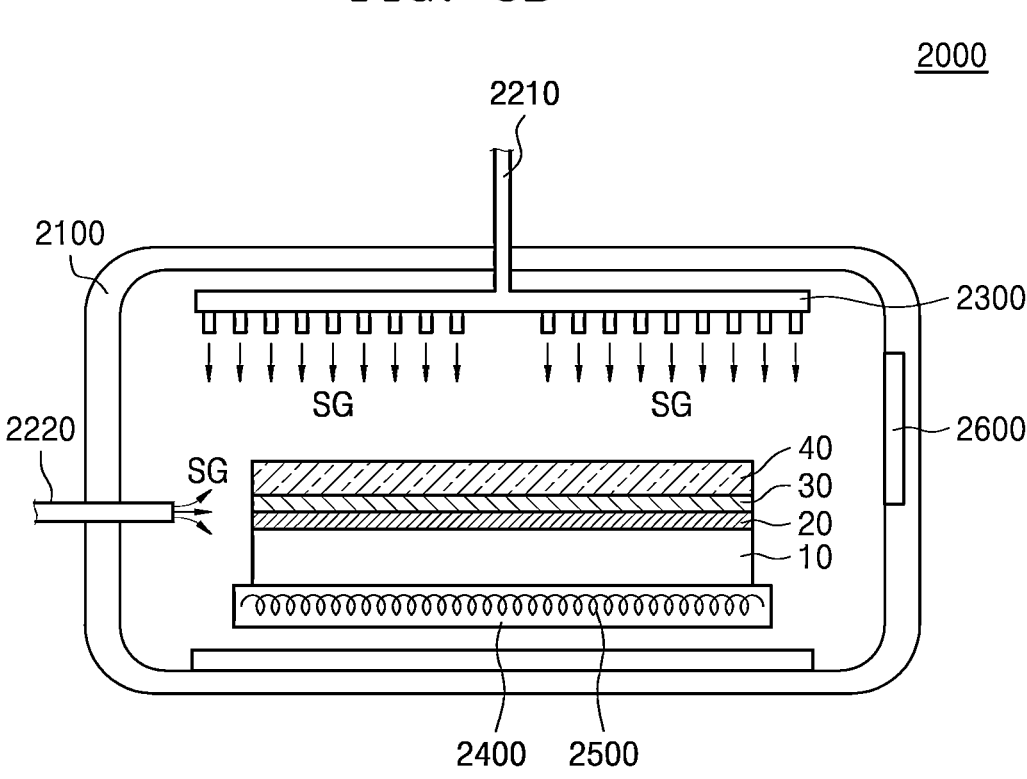

Referring to FIGS. 2 and 3D, the method of manufacturing a pellicle (S100) according to an example embodiment of the technical idea of the present invention may include a fourth operation S140 of loading the support substrate 10 into the semiconductor manufacturing device 2000 and forming a membrane 40 on the catalyst layer 30.

The method of forming the membrane 40 may include loading the support substrate 10 into the vacuum chamber 2100 of the semiconductor manufacturing device 2000, and forming the membrane 40 on the catalyst layer 30 by performing a thin film forming process such as a plasma enhanced CVD (PECVD) process, a low pressure CVD (LPCVD) process, an atomic layer deposition (ALD) process, and a molecular layer deposition (MLD) process.

For example, the thin film forming process may include injecting a hydrocarbon-based source gas SG including carbon (C) such as methane ($CH_4$) or acetylene ($C_2H_2$) into the vacuum chamber 2100 through gas supply pipes 2210 and 2220 and dissociating carbon (C) atoms to form a membrane 40 including a graphite layer on the catalyst layer 30. Alternatively, the source gas SG may include an organic compound having a functional group including carbon, such as a methyl group or an acetyl group.

The gas supply pipes 2210 and 2220 may be installed at an upper portion or a side of the vacuum chamber 2100. When the semiconductor manufacturing device 2000 includes a gas distribution plate 2300, the source gas SG may be uniformly supplied into the vacuum chamber 2100 through the gas distribution plate 2300. The carbon (C) atom may be excited and/or dissociated using plasma energy or thermal energy.

The stage 2400 in the vacuum chamber 2100 of the semiconductor manufacturing device 2000 may include a heater 2500 for heating the catalyst layer 30. Alternatively, a lamp 2600 for heating the catalyst layer 30 may be included in the wall of the vacuum chamber 2100 of the semiconductor manufacturing device 2000. For example, during the thin film forming process, the process may include heating so that the process temperature in the vacuum chamber 2100 is about 1050° C. or less.

Specifically, the sintering process of the graphite layer included in the membrane 40 may be performed at any one temperature selected from about 700° C., about 780° C., about 800° C., about 860° C., and about 900° C. In addition, the sintering process of the graphite layer included in the membrane 40 may be performed for any one time selected from about 1 minute, about 10 minutes, about 30 minutes, and about 60 minutes in the range of about 1 minute to about 120 minutes.

For example, after maintaining the inside of the vacuum chamber 2100 at about 700° C. for about 1 minute, the sintering process of the graphite layer gradually increases the temperature inside the vacuum chamber 2100 to about 900° C. through about 5 minutes. Thereafter, a sintering process of the graphite layer may be performed under process conditions of 20 sccm of methane ($CH_4$) gas, 100 sccm of hydrogen ($H_2$) gas, and a total pressure of 0.33 Torr at a process temperature of about 900° C.

Here, the first surface roughness RS1 of the catalyst layer 30 before forming the membrane 40 may be smaller than the second surface roughness RS2 of the catalyst layer 30 after forming the membrane 40. For example, a change may occur in the numerical value of the surface roughness due to the catalytic reaction of nickel (Ni) in the catalyst layer 30. Specifically, the first surface roughness RS1 may be about 5 nm to about 15 nm, and the second surface roughness RS2 may be about 20 nm to about 35 nm, but the present invention is not limited thereto.

In general, the membrane 40 may have a thickness of several to several tens of nm. As the membrane 40 is thinner, mechanical strength may be lowered and it may be difficult to have a free-standing structure, and conversely, as the membrane 40 is thicker, the transmittance of EUV light is lowered, so that the EUV photolithography process may be adversely affected. In example embodiments, the membrane 40 may have a size of about 50 mm in width and about 50 mm in length. In example embodiments, the graphite layer may have a thickness of about 10 nm to about 30 nm.

In some embodiments, the membrane 40 including the graphite layer may have a thickness of about 20 nm or less so that the transmittance of the EUV light may be about 80% or more, and the reflectance of the EUV light may be about 0.04% or less.

In other embodiments, the membrane 40 may include a single layer or multiple layers of graphite layers, or stacked multiple layers of graphene layers. When the membrane 40 includes multiple graphene layers, since one graphene layer has a thickness of about 0.34 nm, the membrane 40 may include about 60 graphene layers or less.

Figure 6B:
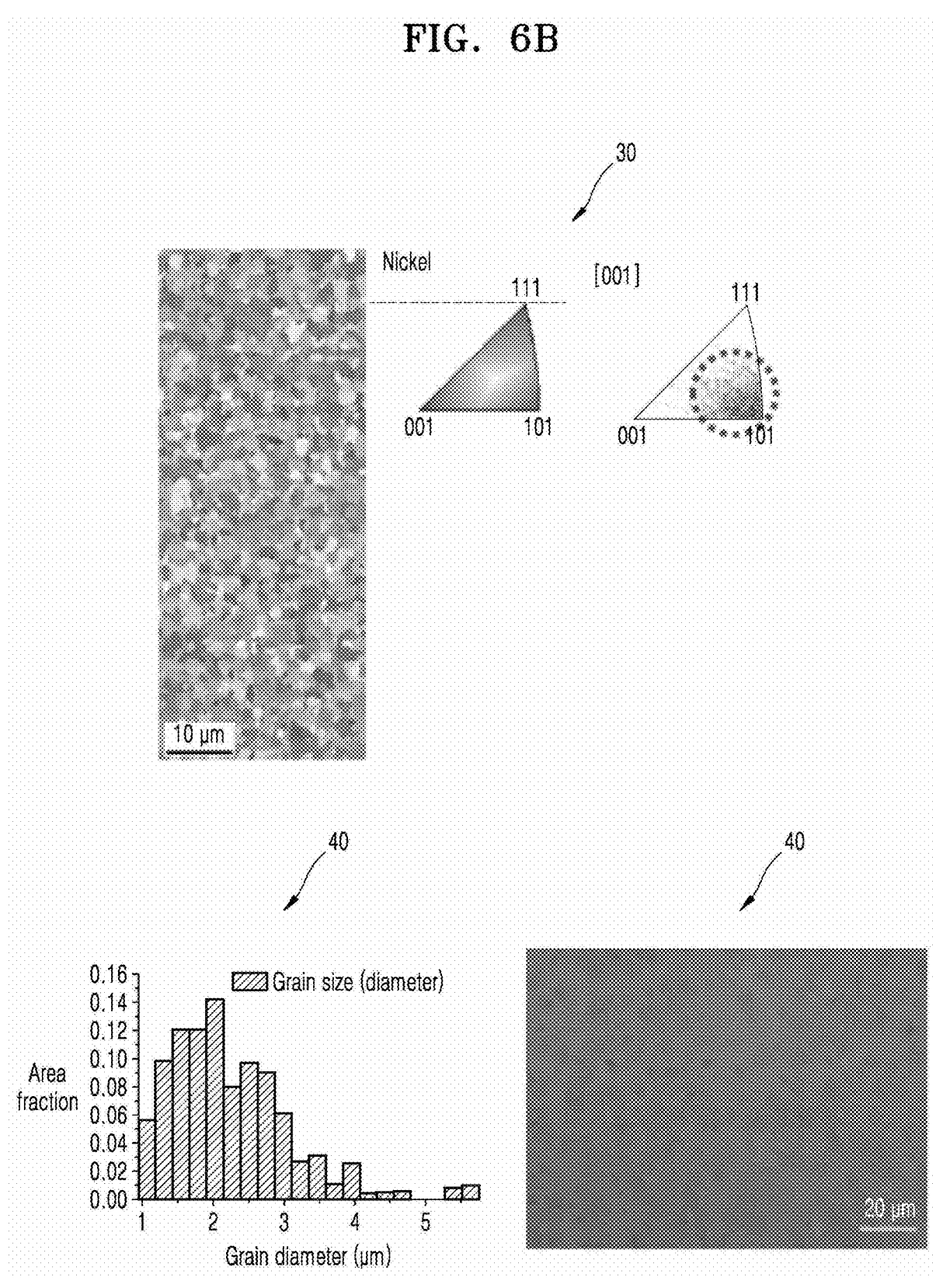

When the catalyst layer 30 was nickel (Ni), experimentally, the morphology of the membrane 40 was superior to that in the case where other metals were used as catalysts. In addition, when the catalyst layer 30 is nickel (Ni) in which the (110) plane or the (100) plane is the dominant crystal plane, experimentally, the morphology of the membrane 40 was very good compared to the case of sintering on other crystal planes. An image of the membrane 40 having a very good morphology is shown in FIG. 6B, which will be described later.

Figure 3E:
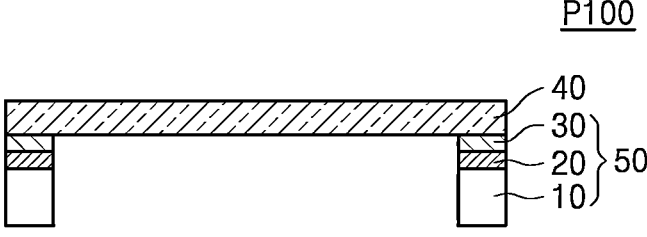

Referring to FIGS. 2 and 3E, the method S100 for manufacturing a pellicle according to an example embodiment of the technical idea of the present invention may include a fifth operation S150 of unloading the support substrate 10 from the semiconductor manufacturing device 2000 (see FIG. 3D) and performing an etching process to form the pellicle P100.

The pellicle P100 includes a membrane 40 and a frame 50 attached to the membrane 40 to support the membrane 40. By etching a part of each of the support substrate 10, the material film 20, and the catalyst layer 30, the frame 50 may be implemented in a lattice shape so that the membrane 40 may be flatly maintained in a freestanding structure on the frame 50. Such a method is called a pellicle manufacturing process by a backside etch process.

Figure 4:
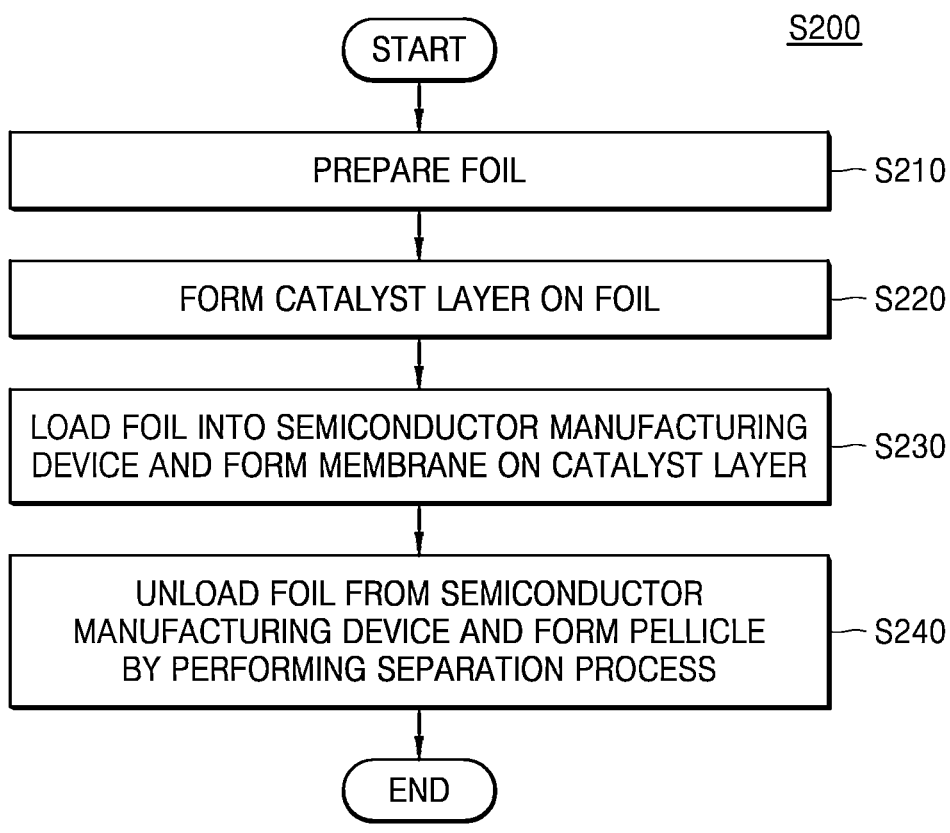
FIG. 4 is a block diagram illustrating a method of manufacturing a pellicle, according to another example embodiment of the technical idea of the present invention.

FIG. 4 is a block diagram illustrating a method of manufacturing a pellicle according to another example embodiment of the technical idea of the present invention, and FIGS. 5A to 5D are views showing a method of manufacturing a pellicle in order according to another example embodiment of the technical idea of the present invention.

In this specification, when an embodiment is implemented differently, a specific process order may be performed differently from the described order. For example, two processes described in succession may be substantially simultaneously performed, or may be performed in an order opposite to the described order.

Referring to FIGS. 4 and 5A, the method S200 for manufacturing a pellicle according to another embodiment of the technical idea of the present invention may include a first operation S210 of preparing the foil 11.

The foil 11 may include nickel (Ni) and may have a flat plate shape. The foil 11 may have a thickness of about 25 m to support a catalyst layer 30 (see FIG. 5B) to be described later.

Referring to FIGS. 4 and 5B, the method S200 for manufacturing a pellicle according to another embodiment of the present invention may include a second operation S220 of forming a catalyst layer 30 on the foil 11.

The catalyst layer 30 may include nickel (Ni). For example, the material constituting the catalyst layer 30 may be substantially the same as the material constituting the foil 11. Specifically, the catalyst layer 30 may include nickel Ni, in which the (111) plane is the dominant crystal plane.

Nickel (Ni) may be formed on the foil 11 under the following conditions so that the catalyst layer 30 may have such a dominant crystal plane. Specifically, nickel (Ni) in the catalyst layer 30 may be formed to have a grain size of about 100 nm or less. In addition, nickel (Ni) in the catalyst layer 30 may be formed to have a thickness of any one selected from about 500 nm, about 1 m, and about 5 m in the range of about 500 nm to about 5 m.

The inventors of the present invention found that nickel (Ni), in which the (111) plane is the dominant crystal plane, significantly affects the sintering of the graphite layer in the catalyst layer 30 grown under the above conditions.

Figure 5C:
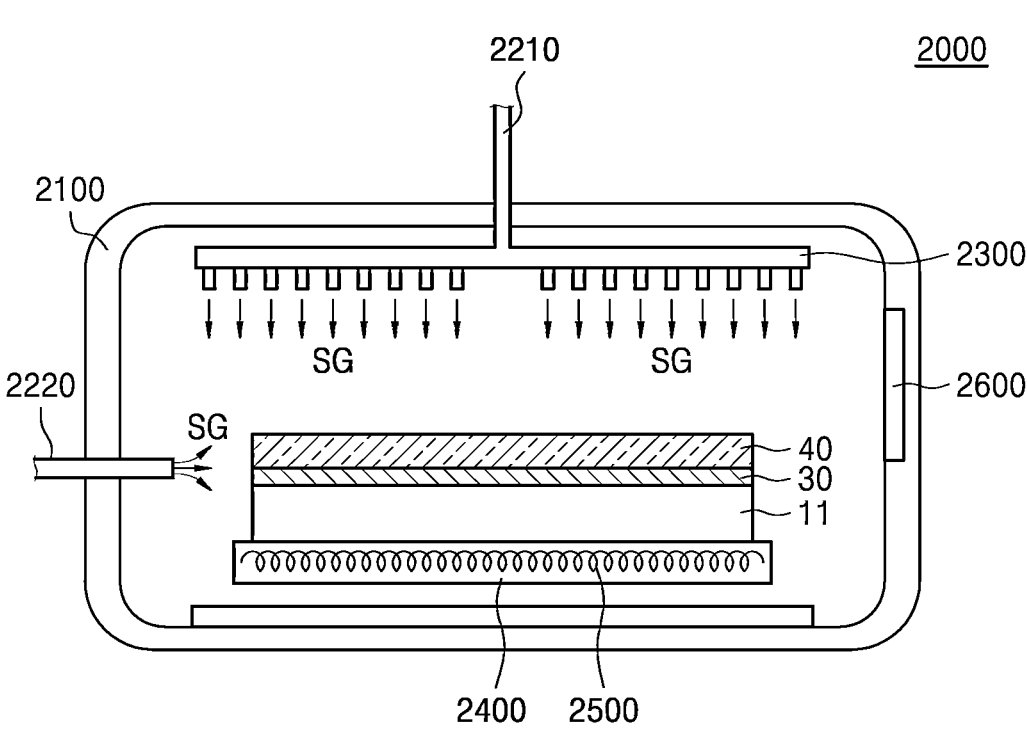

Referring to FIGS. 4 and 5C, the method of manufacturing a pellicle (S200) according to another embodiment of the technical idea of the present invention may include a third operation S230 of loading the foil 11 into the semiconductor manufacturing device 2000 and forming the membrane 40 on the catalyst layer 30.

The method of forming the membrane 40 may include loading the foil 11 into the vacuum chamber 2100 of the semiconductor manufacturing device 2000, and forming the membrane 40 on the catalyst layer 30 by performing a thin film forming process such as a PECVD process, an LPCVD process, an ALD process, an MLD process, and the like. A detailed description of the process for forming the membrane 40 is substantially the same as that described above with reference to FIG. 3D, and thus will be omitted herein.

The sintering process of the graphite layer included in the membrane 40 may be performed at any one temperature selected from about 700° C., about 780° C., about 800° C., about 860° C., and about 900° C. In addition, the sintering process of the graphite layer included in the membrane 40 may be performed for any one time selected from about 1 minute, about 10 minutes, about 30 minutes, and about 60 minutes in the range of about 1 minute to about 120 minutes.

Here, the first surface roughness RS1 of the catalyst layer 30 before forming the membrane 40 may be smaller than the second surface roughness RS2 of the catalyst layer 30 after forming the membrane 40. For example, a change may occur in the numerical value of the surface roughness due to the catalytic reaction of nickel (Ni) in the catalyst layer 30. Specifically, the first surface roughness RS1 may be about 5 nm to about 15 nm, and the second surface roughness RS2 may be about 20 nm to about 35 nm, but the present invention is not limited thereto.

In some embodiments, in the case where the membrane 40 includes a graphite layer, when the membrane 40 has a thickness of about 20 nm or less, the transmittance of the EUV light may be about 80% or more and the reflectance of the EUV light may be about 0.04% or less.

When the catalyst layer 30 was nickel (Ni), experimentally, the morphology of the membrane 40 was superior to that in the case where other metals were used as catalysts. In addition, when the catalyst layer 30 is nickel (Ni) in which the (111) plane is the dominant crystal plane, experimentally, the morphology of the membrane 40 was very good compared to the case of sintering on other crystal planes.

Figure 5D:
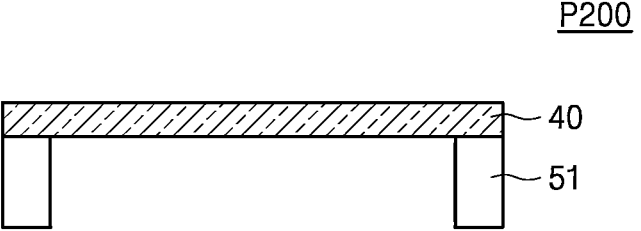

Referring to FIGS. 4 and 5D, the method for manufacturing a pellicle (S200) according to another embodiment of the technical idea of the present invention may include a fourth operation S240 of unloading the foil 11 from the semiconductor manufacturing device 2000 (see FIG. 5C) and forming the pellicle P200 by performing a separation process.

After separating the membrane 40 from the foil 11, the pellicle P200 may be manufactured by attaching the separated membrane 40 on the frame 51 prepared in advance. Specifically, the process of separating the membrane 40 from the foil 11 may include a wet process. The wet process may include immersing the foil 11 on which the membrane 40 is formed in a water bath containing a solvent and separating the membrane 40 from the foil 11.

The solvent may include a metal etchant. For example, the solvent may include at least one of hydrogen peroxide, phosphoric acid, nitric acid, acetic acid, a cyclic amine compound, and deionized water.

The separation process may also be performed in the above-described method S100 for manufacturing the pellicle. Specifically, in the operation S150 of forming the pellicle P100, the separation process may be performed instead of the etching process. After separating the membrane 40 from the foil 11, the pellicle P200 may be manufactured by attaching the separated membrane 40 on the frame 51 prepared in advance. The process of separating the membrane 40 from the support substrate 10 (see FIG. 3D) may include a wet process.

FIGS. 6A and 6B are images showing analysis results of a catalyst layer and a membrane according to example embodiments of the technical concept of the present invention.

Referring to FIG. 6A, the characteristic change of nickel (Ni) according to the dominant crystal plane in the catalyst layer is shown.

(1) Classification A: Nickel (Ni) in which a (111) Plane is the Dominant Crystal Plane ① Surface Roughness Characteristics The first surface roughness RS1 of nickel (Ni) before forming the membrane may be smaller than the second surface roughness RS2 of nickel (Ni) after forming the membrane. For example, the numerical value of the surface roughness may be changed due to the catalytic reaction of nickel (Ni). Here, each of the first and second surface roughness RS1 and RS2 were evaluated as an average roughness Ra of the surface.

Specifically, the first surface roughness RS1 may be about 5.2 nm, and the second surface roughness RS2 may be about 15.8 nm.

② Characteristics of Grain Size

The grain size of nickel (Ni) after forming the membrane may be about 1.1±0.7 m. The grain size of nickel (Ni) may affect the grain size of the membrane in subsequent processes.

③ Crystal Plane Properties

Through X-ray diffraction (XRD) analysis, the change in the crystal plane of nickel (Ni) after the formation of the membrane was observed. Here, it may be confirmed through the peak of the crystal plane that most of the crystal planes of nickel (Ni) are (111) planes. Through electron backscatter diffraction (EBSD) analysis, a distribution result of the crystal plane shows that a (111) plane is the dominant crystal plane.

(2) Classification B: Nickel (Ni) in which a (100) Plane is the Dominant Crystal Plane ① Surface Roughness Characteristics The first surface roughness RS1 of nickel (Ni) before forming the membrane may be smaller than the second surface roughness RS2 of nickel (Ni) after forming the membrane. Specifically, the first surface roughness RS1 may be about 11.4 nm, and the second surface roughness RS2 may be about 26 nm.

② Characteristics of Grain Size

The grain size of nickel (Ni) after forming the membrane may be about 1.0±0.3 m. The grain size of nickel (Ni) may affect the grain size of the membrane in subsequent processes.

③ Crystal Plane Properties

Through XRD analysis, the change in the crystal plane of nickel (Ni) after the formation of the membrane was observed. Here, it may be confirmed through the peak of the crystal plane that a portion of the crystal plane of nickel (Ni) is changed to the (111) plane during the sintering process. Through EBSD analysis, a distribution result of the crystal plane shows that a (100) plane is the dominant crystal plane.

(3) Classification C: Nickel (Ni) in which a (110) Plane is the Dominant Crystal Plane ① Surface Roughness Characteristics The first surface roughness RS1 of nickel (Ni) before forming the membrane may be smaller than the second surface roughness RS2 of nickel (Ni) after forming the membrane. Specifically, the first surface roughness RS1 may be about 10.9 nm, and the second surface roughness RS2 may be about 31.6 nm.

② Characteristics of Grain Size

The grain size of nickel (Ni) after forming the membrane may be about 1.2±0.7 m. The grain size of nickel (Ni) may affect the grain size of the membrane in subsequent processes.

③ Crystal Plane Properties

Through XRD analysis, the change in the crystal plane of nickel (Ni) after the formation of the membrane was observed. Here, it may be confirmed through the peak of the crystal plane that most of the crystal planes of nickel (Ni) are (110) planes. Through EBSD analysis, a distribution result of the crystal plane shows that a (110) plane is the dominant crystal plane.

Referring to FIG. 6B, the grain size distribution of the membrane 40 formed in the catalyst layer 30 including nickel (Ni), in which the (110) plane is the dominant crystal plane, is shown.

As shown in the upper part of the figure, by using the backscattering electron diffraction analysis method on nickel (Ni) in the catalyst layer 30, it may be confirmed that the dominant crystal plane of nickel (Ni) is the (110) plane.

As shown in the lower left of the drawing, it may be seen that the grain size of the membrane 40 formed in the catalyst layer 30 including nickel (Ni), in which the (110) plane is the dominant crystal plane, is mainly distributed in the range of about 1 m to about 3 m and is uniform.

When the catalyst layer 30 is nickel (Ni), experimentally, the morphology of the membrane 40 is superior to the case where other metals are used as catalysts. In addition, when the catalyst layer 30 is nickel (Ni) in which the (110) plane is the dominant crystal plane, experimentally, the morphology of the membrane 40 was very good compared to the case of sintering on other crystal planes.

The crystal plane direction of nickel (Ni) in the catalyst layer 30 may cause a difference in the precipitation pattern of carbon (C). In order to realize the membrane 40 including the graphite layer having a free-standing structure and having a uniform graphite layer, dense nucleation may be induced on the catalyst layer 30 by controlling the grain size. By using nickel (Ni), in which the (110) plane is the dominant crystal plane, in the catalyst layer 30, together with minimization of pinholes (less than about 1% of the total area of the graphite layer), the uniformity of the thickness may be controlled through the uniformity of the grain size of the graphite layer.

As shown in the lower right of the drawing, when the membrane 40 having a thickness of about 10 nm to about 30 nm of the graphite layer is observed using an optical microscope at a magnification of about 500 times, it may be seen that the morphology of the membrane 40 is very good. The graphite layer constituting the membrane 40 has a polycrystalline structure, and the polycrystal grain size may be composed of only about 1 m or less. This may be a characteristic of the membrane 40 formed in the catalyst layer 30 including nickel (Ni) in which the (110) plane is the dominant crystal plane according to the technical concept of the present invention.

Here, only the catalyst layer 30 containing nickel (Ni) in which the (110) plane is the dominant crystal plane has been described, but a person skilled in the art will appreciate that the membrane 40 having substantially the same or similar characteristics may be implemented even in nickel (Ni) in which the (111) plane or the (100) plane is the dominant crystal plane.

Figure 7:
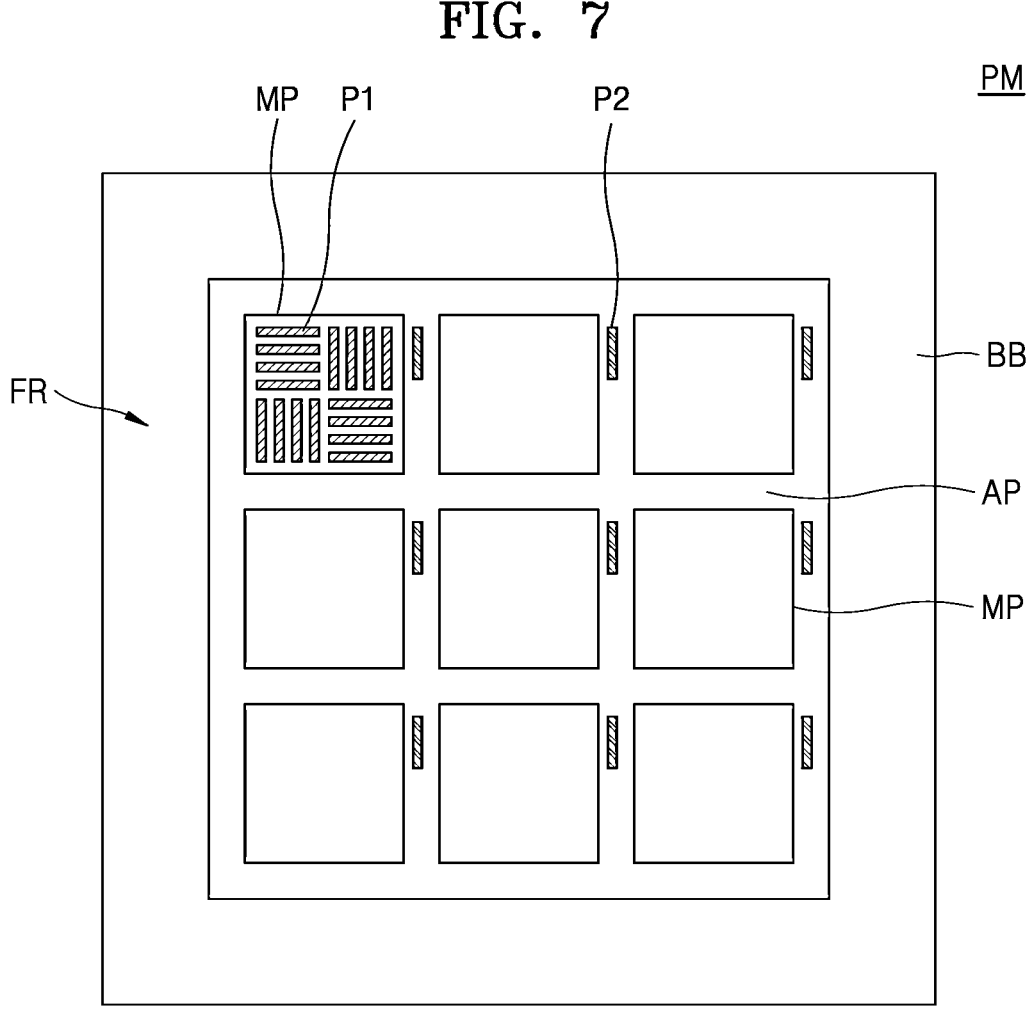
FIG. 7 is a plan view illustrating an EUV photomask capable of being combined with a pellicle, according to example embodiments of the present invention.

FIG. 7 is a plan view illustrating an EUV photomask capable of being combined with a pellicle according to example embodiments of the present invention.

Referring to FIG. 7, the EUV photomask PM is a reflective photomask for manufacturing an integrated circuit such as a semiconductor device by transferring a pattern onto a semiconductor wafer through an exposure process.

In some embodiments, the EUV photomask PM is for use in an EUV photolithography process using an exposure wavelength in the EUV wavelength range, for example, about 13.5 nm, and may be a reflective photomask based on a multilayer mirror structure.

The front surface FR of the EUV photomask PM may have a main pattern area MP for transferring a main pattern required to form a unit element constituting an integrated circuit in a chip area on a semiconductor wafer, an auxiliary pattern area AP for transferring an auxiliary pattern to a scribe lane area on the semiconductor wafer, and a black border area BB surrounding the main pattern area MP and the auxiliary pattern area AP.

In the main pattern area MP, a main pattern element P1 constituting a main pattern for transferring a pattern required for forming an integrated circuit on a chip area on a semiconductor wafer may be formed.

In the auxiliary pattern area AP, instead of a pattern constituting an integrated circuit to be implemented, an auxiliary pattern, for example, an auxiliary pattern element P2 for transferring an align key pattern to a scribe lane area on a semiconductor wafer, necessary in the manufacturing process of the integrated circuit but not remaining in the final product of the integrated circuit may be formed.

The black border area BB is a non-patterned area that does not include a pattern element for transferring a pattern onto a semiconductor wafer.

Figure 8:
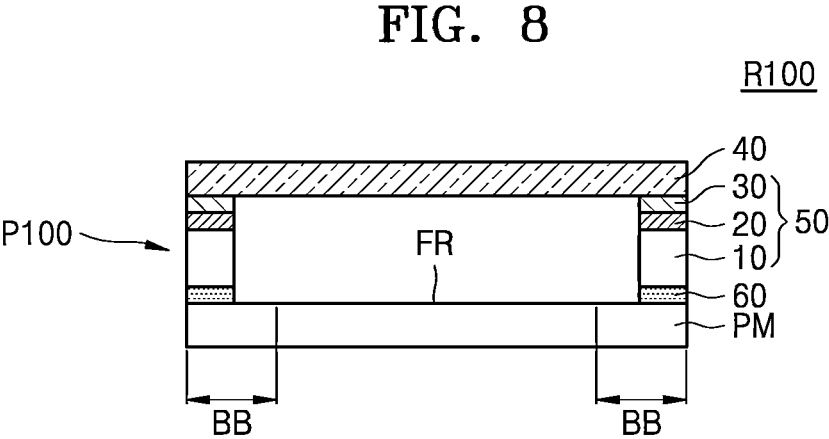
FIG. 8 is a cross-sectional view illustrating an EUV photomask assembly including a pellicle, according to example embodiments of the present invention.

FIG. 8 is a cross-sectional view illustrating an EUV photomask assembly including a pellicle according to example embodiments of the present invention.

Referring to FIG. 8, the EUV photomask assembly R100 includes an EUV photomask PM and a pellicle P100 fixed on the black border area BB on the front surface FR of the EUV photomask PM.

In order to fix the pellicle P100 on the black border area BB of the EUV photomask PM, an adhesive layer 60 is included between the surface of the frame 50 included in the pellicle P100 opposite to the side to which the membrane 40 is attached and the black border area BB of the EUV photomask PM.

The frame 50 has one end fixed to the membrane 40 through an adhesive layer 60 to support the membrane 40 and the other end fixed to the surface of the EUV photomask PM through an adhesive layer 60. For a more detailed configuration of the pellicle P100, refer to the bar described with reference to FIG. 3E.

In some embodiments, the adhesive layer 60 may be made of a silicone resin, a fluorine resin, or an acrylic resin, but is not limited thereto.

Figure 9:
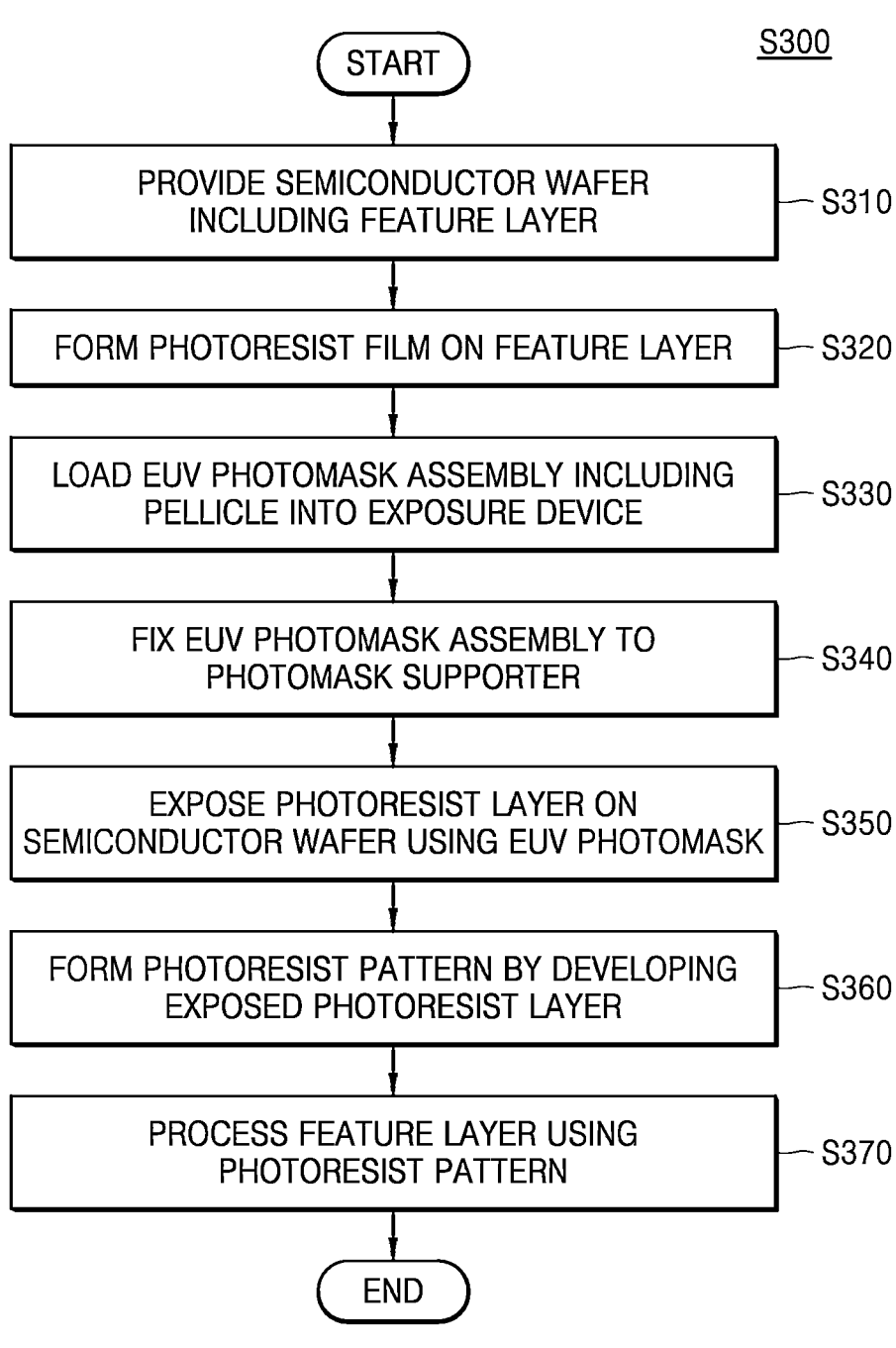
FIG. 9 is a block diagram illustrating a method of manufacturing a semiconductor device, according to example embodiments of the present invention.

FIG. 9 is a block diagram illustrating a method of manufacturing a semiconductor device according to embodiments of the present invention.

In this specification, when an embodiment is implemented differently, a specific process order may be performed differently from the described order. For example, two processes described in succession may be substantially simultaneously performed, or may be performed in an order opposite to the described order.

Referring to FIG. 9, the method S300 of manufacturing a semiconductor device may include a first process S310 to a seventh process S370.

First, a first process S310 of providing a semiconductor wafer including a feature layer may be included. In some embodiments, the feature layer may be a conductive layer or an insulating layer formed on a semiconductor wafer. For example, the feature layer may be made of a metal, a semiconductor, or an insulating material. In other embodiments, the feature layer may be part of the semiconductor wafer.

Next, a second process S320 of forming a photoresist layer on the feature layer may be included. In some embodiments, the photoresist film may be made of a resist material for EUV (6.75 nm or 13.5 nm). In other embodiments, the photoresist film may be formed of a resist for an F2 excimer laser (157 nm), a resist for an ArF excimer laser (193 nm), or a resist for a KrF excimer laser (248 nm). The photoresist layer may be formed of a positive photoresist or a negative photoresist.

In some embodiments, in order to form a photoresist film made of the positive photoresist, a photoresist composition including a photosensitive polymer having an acid-labile group, a potential acid, and a solvent may be spin-coated on the feature layer.

In some embodiments, the photosensitive polymer may include a (meth)acrylate-based polymer. The (meth)acrylate-based polymer may be an aliphatic (meth)acrylate-based polymer. In addition, the photosensitive polymer may be substituted with various protecting groups decomposable by acid.

In some embodiments, the potential acid may consist of a photoacid generator (PAG), a thermoacid generator (TAG), or a combination thereof. In some embodiments, the PAG may be made of a material that generates an acid when exposed to any one light selected from EUV light, F2 excimer laser, ArF excimer laser, and KrF excimer laser.

Next, a third process S330 of loading the EUV photomask assembly including the pellicle according to the technical spirit of the present invention into the exposure device may be included. In some embodiments, the EUV photomask assembly may be any one of the EUV photomask assembly R100 described with reference to FIG. 8 and EUV photomask assemblies modified therefrom within the scope of the present invention.

Next, a fourth process S340 of fixing the EUV photomask assembly to the photomask supporter may be included. In some embodiments, the photomask supporter may be the photomask supporter 1300 of the EUV exposure device 1000 illustrated in FIG. 1A.

Next, a fifth process S350 of exposing the photoresist layer on the semiconductor wafer using an EUV photomask may be included. In some embodiments, the exposure process may be performed in a reflective exposure device, but is not limited thereto. For example, a transmissive exposure device may be used in the exposure process.

Next, a sixth process S360 of forming a photoresist pattern by developing the exposed photoresist layer may be included.

Finally, a seventh process S370 of processing the feature layer using a photoresist pattern may be included. In some embodiments, in order to process the feature layer, the feature layer may be etched using the photoresist pattern as an etch mask to form a fine feature pattern.

In other embodiments, impurity ions may be implanted into the feature layer by using the photoresist pattern as an ion implantation mask to process the feature layer.

In other embodiments, in order to process the feature layer, a separate process film may be formed on the feature layer exposed through the photoresist pattern. The process film may be formed of a conductive film, an insulating film, a semiconductor film, or a combination thereof.

While the inventive concept has been particularly shown and described with reference to embodiments thereof, it will be understood that various changes in form and details may be made therein without departing from the spirit and scope of the following claims.

What is claimed is:

1. A method for manufacturing a pellicle, the method comprising:
  preparing a support substrate;
  forming a catalyst layer on the support substrate, the catalyst layer including nickel (Ni) in which a (110) plane is a dominant crystal plane; and
  performing a chemical vapor deposition process on the catalyst layer at about 1050° C. or less to form a membrane having a graphite layer,
  wherein a first surface roughness of the catalyst layer before forming the membrane is about 5 nm to about 15 nm,
  wherein a second surface roughness of the catalyst layer after forming the membrane is about 20 nm to about 35 nm,
  wherein the membrane is used in lithography equipment using extreme ultraviolet (EUV) light as a light source,
  wherein in the membrane, a transmittance of the EUV light is about 80% or more, and a reflectance of the EUV light is about 0.04% or less, and
  wherein the graphite layer of the membrane has a polycrystalline structure, and a polycrystal grain size is about 1 μm or less.

2. The method of claim 1,
  wherein the nickel (Ni) in the catalyst layer has a crystal size of about 100 nm or less, and
  wherein the nickel (Ni) in the catalyst layer has a thickness selected from about 500 nm to about 5 μm.

3. The method of claim 1, wherein a sintering process of the graphite layer is performed at a temperature selected from about 700° C., about 780° C., about 800° C., about 860° C., and about 900° C.

4. The method of claim 3, wherein the sintering process of the graphite layer is performed for a time selected from about 1 minute to about 120 minutes.

5. The method of claim 1, further comprising:
  forming one material film between the support substrate and the catalyst layer, the material film selected from silicon oxide, silicon nitride, metal oxide, and polymer thin film.

6. The method of claim 5, wherein a thickness of the material film is between about 100 nm and about 300 nm.

7. A method for manufacturing a pellicle, the method comprising:
  preparing a nickel (Ni) foil;
  forming a catalyst layer on the nickel (Ni) foil, the catalyst layer including nickel (Ni), in which a (110) plane is a dominant crystal plane;
  performing a chemical vapor deposition process on the catalyst layer at about 1050° C. or less to form a membrane having a graphite layer; and
  removing the nickel (Ni) foil,
  wherein a first surface roughness of the catalyst layer before forming the membrane is from about 5 nm to about 15 nm, and
  wherein a second surface roughness of the catalyst layer after forming the membrane is about 20 nm to about 35 nm,
  wherein the membrane is used in lithography equipment using extreme ultraviolet (EUV) light as a light source, and
  wherein in the membrane, a transmittance of the EUV light is about 80% or more, and a reflectance of the EUV light is about 0.04% or less, and
  wherein the graphite layer of the membrane has a polycrystalline structure, and a polycrystal grain size is about 1 μm or less.

8. The method of claim 7, wherein a thickness of the nickel (Ni) foil is about 25 μm.

9. The method of claim 7,
  wherein nickel (Ni) in the catalyst layer has a crystal size of about 100 nm or less, and
  wherein the nickel (Ni) in the catalyst layer has a thickness selected from about 500 nm to about 5 μm.

10. A method of manufacturing a pellicle for extreme ultraviolet (EUV) exposure used in lithography equipment using EUV light as a light source, the method comprising:
  preparing a support substrate;
  forming a catalyst layer on the support substrate, the catalyst layer including nickel (Ni), in which a (110) plane is a dominant crystal plane;
  forming a membrane having a graphite layer on the catalyst layer by performing a chemical vapor deposition process using a hydrocarbon-based precursor at about 1050° C. or less; and
  transferring the membrane having the graphite layer onto a frame,
  wherein a first surface roughness of the catalyst layer before forming the membrane is from about 5 nm to about 15 nm,
  wherein a second surface roughness of the catalyst layer after forming the membrane is about 20 nm to about 35 nm, wherein in the membrane, a transmittance of the EUV light is about 80% or more, and a reflectance of the EUV light is about 0.04% or less, and wherein the graphite layer of the membrane has a polycrystalline structure, and a polycrystal grain size is about 1 μm or less.

11. The method of claim 10, wherein the membrane has a size of about 50 mm in width and about 50 mm in length.

12. The method of claim 10, wherein a thickness of the graphite layer is about 10 nm to about 30 nm.

13. The method of claim 10, wherein the support substrate is a silicon (Si) wafer substrate or a nickel (Ni) foil having a thickness of about 25 μm.

14. The method of claim 10, wherein the catalyst layer acts as a catalyst in the forming of the membrane having the graphite layer.

15. The method of claim 1, wherein a surface roughness of the catalyst layer changes from the first surface roughness to the second surface roughness due to a catalytic reaction of the nickel (Ni) in the catalyst layer.

16. The method of claim 1, wherein the nickel (Ni) in the catalyst layer is formed to have a thickness of any one selected from about 500 nm, about 1 μm, or about 5 μm.

* * * * *